(12) United States Patent
Motomatsu et al.

(10) Patent No.: US 6,689,493 B2
(45) Date of Patent: Feb. 10, 2004

(54) ORGANIC ELECTROLUMINESCENT ELEMENT AND ORGANIC ELECTROLUMINESCENT DISPLAY

(75) Inventors: Toshihiko Motomatsu, Tokyo (JP); Yoshikazu Sakaguchi, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/932,194

(22) Filed: Aug. 17, 2001

(65) Prior Publication Data

US 2002/0015860 A1 Feb. 7, 2002

Related U.S. Application Data

(63) Continuation-in-part of application No. 09/788,883, filed on Feb. 20, 2001.

(30) Foreign Application Priority Data

Feb. 18, 2000 (JP) ........................................ 2000-040925
Feb. 19, 2001 (JP) ........................................ 2001-042102

(51) Int. Cl.⁷ .............................................. H05B 33/12
(52) U.S. Cl. ..................... 428/690; 428/917; 313/504; 313/506; 257/102; 257/103
(58) Field of Search ................. 428/690, 917; 313/504, 506; 257/102, 103

(56) References Cited

U.S. PATENT DOCUMENTS 5,759,444 A * 6/1998 Enokida et al. ........ 252/301.16

FOREIGN PATENT DOCUMENTS

| JP | 10-72581 A | 3/1998 | ........... C09K/11/06 |
|---|---|---|---|
| JP | 10/88121 A | 4/1998 | ........... C09K/11/06 |
| JP | 2828821 B2 | 9/1998 | ........... H05B/33/14 |
| JP | 10-330295 A | 12/1998 | ........... C07C/13/64 |
| JP | 11-233261 A | 8/1999 | ........... H05B/33/14 |

OTHER PUBLICATIONS

English language translation of JP 10–330295 (12–1998).*
Tang, "An Overview of Organic Electroluminescent Materials and Devices" SID 96 Digest 14/1, pp 181–184, 1996., (no month).

* cited by examiner

*Primary Examiner*—Marie Yamnitzky
(74) *Attorney, Agent, or Firm*—Hayes Soloway P.C.

(57) ABSTRACT

An organic EL element including an anode and a cathode opposing each other, and having a luminescent layer positioned therebetween, including an aromatic amine derivative designated by a general formula [1] and a dibenzo-{[f,f']-4, 4',7,7'-tetraphenyl}-diindeno-[1,2,3-cd:1',2', 3'-lm] perylene derivative designated by a general formula [2]. The organic EL element has excellent luminescent efficiency, brightness and chromaticity.

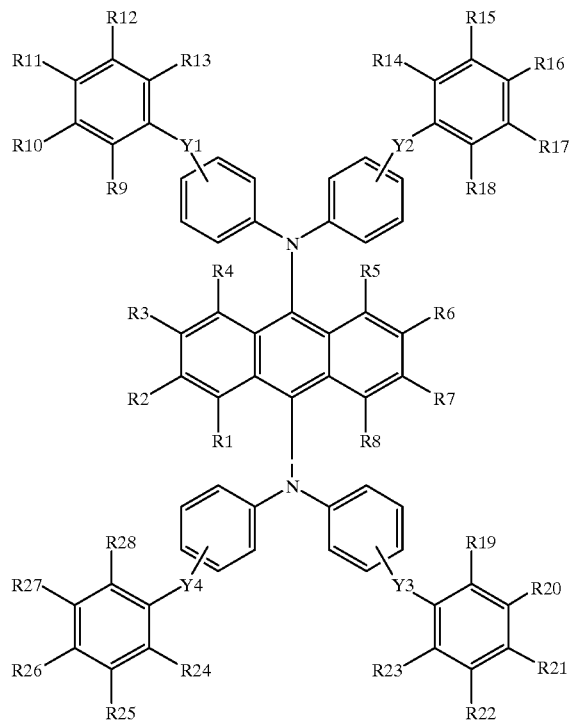

[General Formula 1]

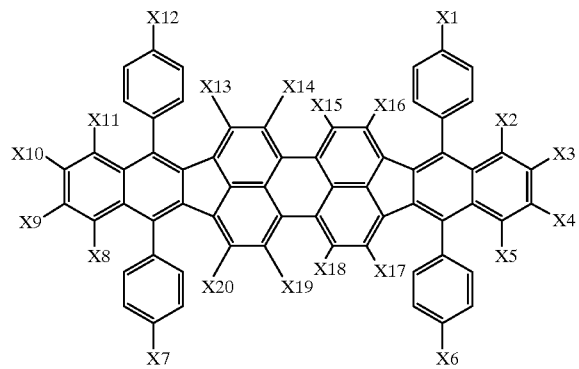

[General Formula 2]

30 Claims, 4 Drawing Sheets (※) LUMINANT ORGANIC ALUMINUM COMPLEX + RED LIGHT EMITTING MATERIAL (※) AROMATIC AMINE DERIVATIVE + PERYLENE DERIVATIVE

ORGANIC ELECTROLUMINESCENT ELEMENT AND ORGANIC ELECTROLUMINESCENT DISPLAY

This application is a continuation-in-part of application Ser. No. 09/788,883, filed Feb. 20, 2001.

BACKGROUND OF THE INVENTION (a) Field of the Invention

The present invention relates to an organic electroluminescent (EL) element, and more specifically to the red organic EL element having excellent luminescent efficiency, brightness and chromaticity, and an organic EL display using the organic EL element.

(b) Description of the Related Art

In a conventional organic EL element, especially a conventional red organic EL element, an ordinarily used luminescent organic aluminum complex having a higher fluorescent quantum yield, or an aromatic amine derivative is used as a host, and the host doped with a red light emitting material is used as a luminescent layer for obtaining the brightness in a practical use.

The luminescent organic aluminum complex is designated by $(Q)_3$-Al (general formula [a], wherein "Q" is a substituted or non-substituted 8-quinolinolate ligand), and the aromatic amine derivative is designated by a general formula [b] (wherein each of A1 to A4 independently designates an aryl group having a carbon number between 6 and 18, and each of tR1 to R8 independently designates a hydrogen atom, a halogen atom, an alkyl group, an alkoxy group, an aryl group or an amino group).

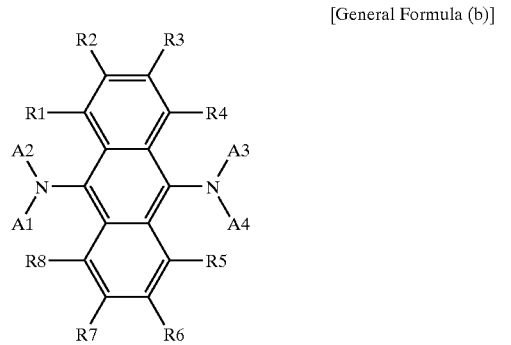

[General Formula (b)]

For example, in the organic EL element described in "An Overview of Organic Electroluminescent Materials and Devices", SID 96DIGEST, 14.1, pp.181–184 (1996) by C. W. Tang, a luminescent layer is prepared by doping a luminescent organic aluminum complex [tris-(8-quinolinolate) aluminum] designated by a compound [4] acting as a host, with a red luminescent material (DCJT). JP-A-10(1998)-72581 describes a luminescent layer formed by the aromatic amine derivative acting as a host, designated by the general formula [b], and doped with a red luminescent material.

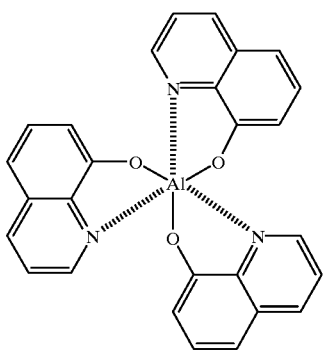

[Compound 4]

From the practical standpoint, the current organic EL element requires thermal stability. Accordingly, a hole injecting layer with the resistance to higher temperature is inserted between the anode and a hole transporting layer. Although the hole injecting layer extends a period of life of the organic EL element, the hole injecting ability into the luminescent layer is deteriorated. As a result, a recombination yield in the luminescent layer is lowered and a sufficient luminescent efficiency cannot be obtained. Further, a problem arises that an electron leaks from the luminescent layer due to an applied voltage, or a carrier balance is changed so that the hole transporting layer itself emits light to change the color shade.

A conventional organic EL element will be described with reference to the annexed drawing.

As shown in FIG. 1, the conventional organic EL element includes a transparent anode 12 made of ITO (indium-tin oxide), a hole injecting layer 13, a hole transporting layer 14, a luminescent layer 15, an electron transporting layer 16 and a cathode 17 sequentially stacked on a glass substrate 11. The luminescent layer 15 includes, as a host, an organic metal complex having a higher fluorescent quantum yield (general formula [a]), doped with the red light emitting material. The same or another organic metal complex (general formula [a]) having the electron transporting ability may be used in the electron transporting layer 16.

As mentioned before, the use of the hole injecting layer with the resistance to higher temperature provides the reduction of the recombination yield between the hole and the electron in the luminescent layer, accompanied by the change of the color shade. Accordingly, the organic EL device having the excellent luminescent efficiency, the higher brightness and the permanently stabilized chromaticity cannot be conventionally obtained. This is because the hole injecting ability into the luminescent layer is low, and the electron transporting ability is changed due to increase of a voltage so that the recombination normally occurring in the luminescent layer actually occurs in the hole transporting layer in place of the luminescent layer.

SUMMARY OF THE INVENTION

In view of the foregoing, an object of the present invention is to provide an organic EL element having excellent luminescent efficiency, brightness and chromaticity.

The present invention provides an organic EL element including an anode and a cathode opposing to each other, and at least one luminescent layer, positioned therebetween, including an aromatic amine derivative designated by a general formula [1], [4], [5] or [6] and a dibenzo-{[f,f']-4,4',7,7'-tetraphenyl}-diindeno-[1,2,3-cd:1',2',3'-lm] perylene derivative designated by a general formula [2].

[General Formula 1]

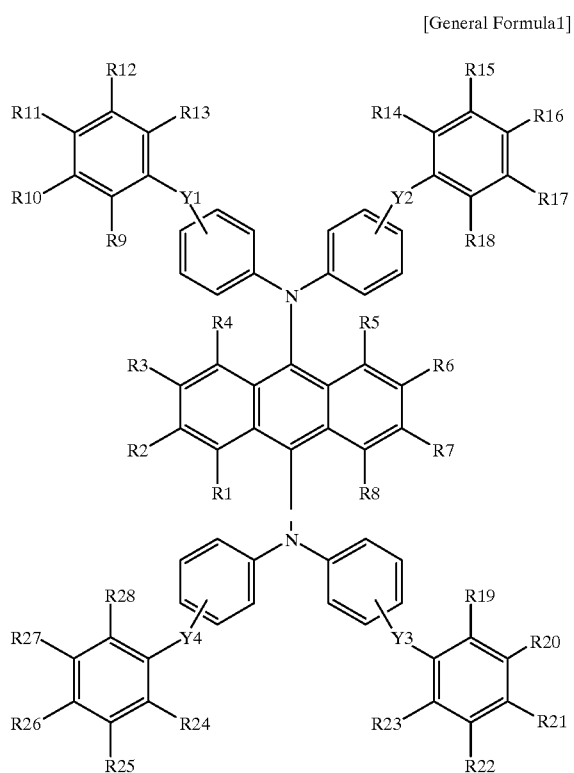

Wherein each of R1 to R 28 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, each of Y1 to Y4 is independently selected from the group consisting of O, S, $SO_2$, CO=O, $CH_2O$, $CH_2OCH_2$ and a substituted or non-substituted alkylene group, and two of R1 to R4 and/or two of R5 to R8 may be bonded to form a substituted or non-substituted five-membered or six-membered ring.

[General Formula 4]

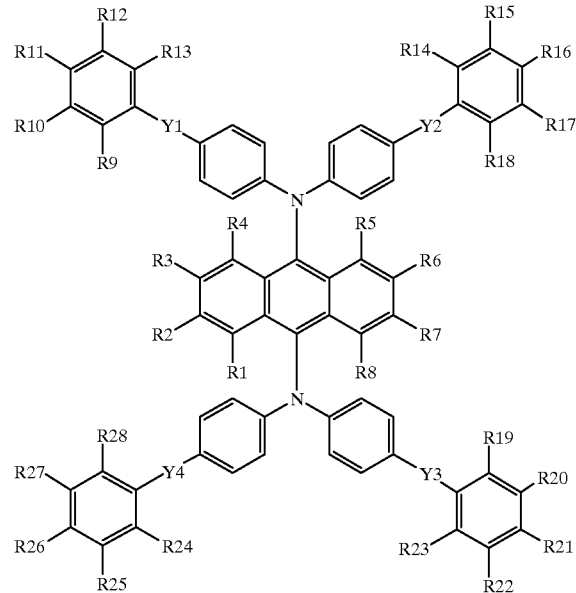

Wherein each of R1 to R 28 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, each of Y1 to Y4 is independently selected from the group consisting of O, S, $SO_2$, C=O, $CH_2O$, $CH_2OCH_2$ and a substituted or non-substituted alkylene group, and two of R1 to R4 and/or two of R5 to R8 may be bonded to form a substituted or non-substituted five-membered or six-membered ring.

[General Formula 5]

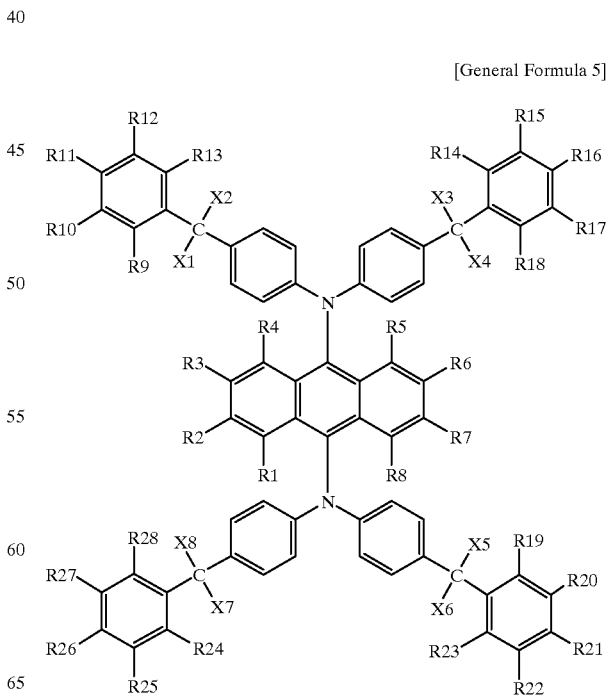

Wherein each of R1 to R 28 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, each of X1 to X8 is independently selected from the group consisting of a substituted or non-substituted alkyl group having a carbon number of 1 to 20 and a substituted or non-substituted aryl group having a carbon number of 6 to 16, and two of R1 to R4 and/or two of R5 to R8 may be bonded to form a substituted or non-substituted five-membered or six-membered ring.

[General Formula 6]

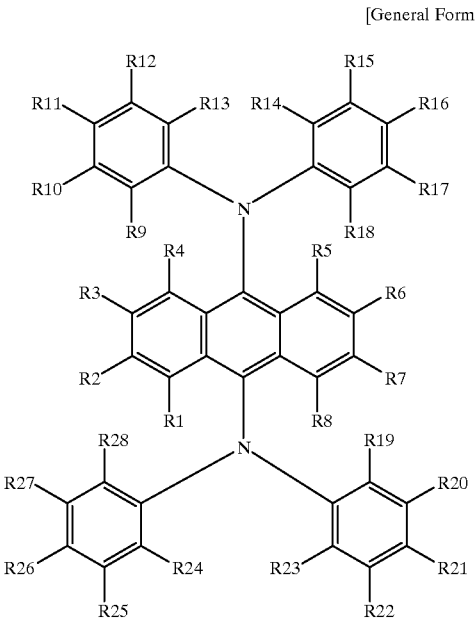

Wherein each of R1 to R 28 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, and two of R1 to R4 and/or two of R5 to R8 may be bonded to form a substituted or non-substituted five-membered or six-membered ring.

[General Formula 2]

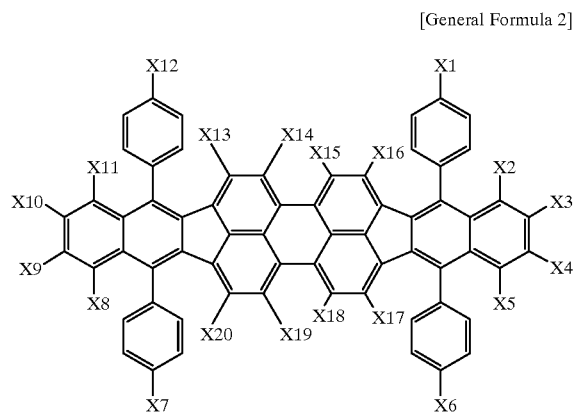

wherein each of X1 to X20 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, and two of X1 to X20 may be bonded to form a substituted or non-substituted five-membered or six-membered ring.

In accordance with the present invention, the aromatic amine derivative and the perylene derivative in the luminescent layer can provide an excellent hole transporting ability (electron blocking ability) to the luminescent layer. As a result, the hole injecting efficiency into the luminescent layer is improved to elevate the recombination efficiency between the hole and the electron in the luminescent layer, thereby providing the higher brightness. The luminescent layer also acts as an electron blocking layer to prevent the permeation of the electron through the luminescent layer, thereby elevating the purity of the color. Further, the combination of a triphenyldiamine derivatives designated by the general formulae [1], [4], [5] and [6] having a longer period of life and the perylene derivative designated by the general formula [2] which is a non-crystalline material considerably extend the period of life.

Because of the excellent characteristics of the organic EL element, the organic EL display using the organic EL element also exhibits excellent display characteristics.

When the electron injection layer or the electron transporting layer contains a plurality of the metal complexes designated by a general formula [3], wherein M designates a metal atom, each of R1 to R6 is independently selected from the group consisting of a hydrogen atom, a halogen atom, a substituted or non-substituted alkyl group, a substituted or non-substituted alkoxy group, a substituted or non-substituted aryl group, a substituted or non-substituted aryloxy group, a substituted or non-substituted cycloalkyl group and a cyano group, L designates a ligand having a halogen atom, a substituted or non-substituted alkoxy group, a substituted or non-substituted aryloxy group, a substituted or non-substituted alkyl group or a substituted or non-substituted cycloalkyl group, and n is 1 or 2, the brightness can be maintained higher. If one organic metal complex is used in the electron injection layer or the electron transporting layer, the agglomeration or the crystallization of the film tends to proceed to deteriorate the electron injecting property and the electron transporting property. On the other hand, two organic metal complexes in the layer increase the amorphous property. Accordingly, the agglomeration or the crystallization hardly occurs even after a longer period of time to suppress the decrease of the electron injecting property and the electron transporting property.

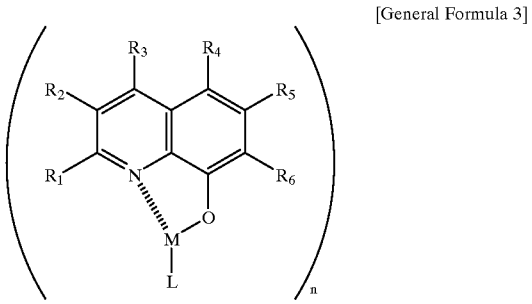

[General Formula 3]

The above and other objects, features and advantages of the present will be more apparent from the following description.

PREFERRED EMBODIMENTS OF THE INVENTION

Now, the present invention is more specifically described with reference to accompanying drawings.

Embodiment 1

Figure 1:
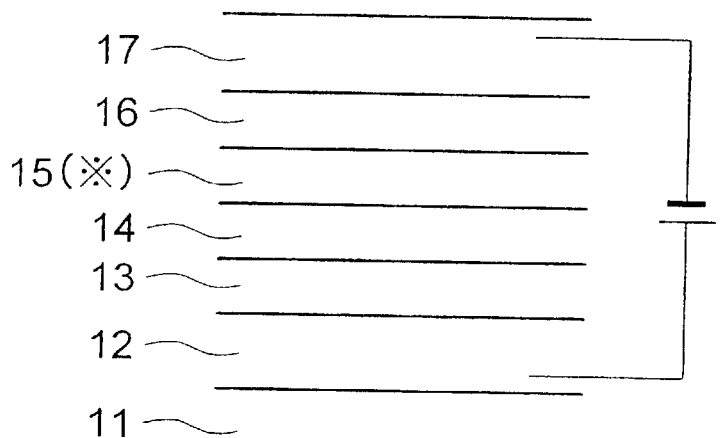
FIG. 1 is a schematic view of a conventional organic EL element.
Figure 2:
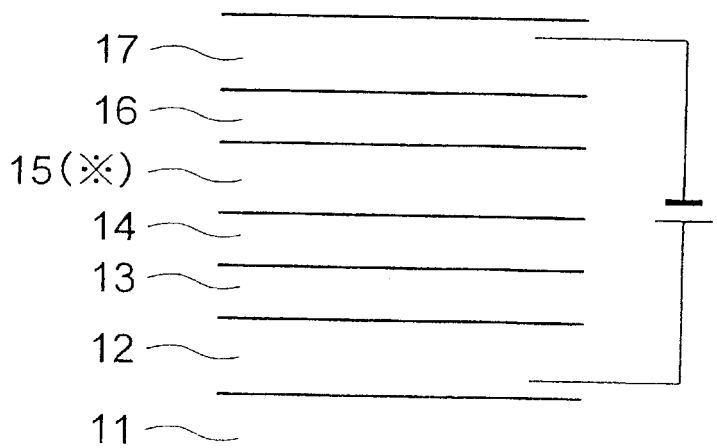
FIG. 2 is a schematic view of an organic EL element in accordance with an Embodiment of the present invention.

As shown in FIG. 2, an organic EL element of the present Embodiment includes a transparent anode 12 made of ITO (indium-tin oxide), a hole injecting layer 13, a hole transporting layer 14, a luminescent layer 15, an electron transporting layer 16 and a cathode 17 sequentially stacked on a glass substrate 11. The hole injecting layer 13 has an excellent resistance to higher temperature for improving the thermal stability of the organic EL element.

The luminescent layer 15 includes an aromatic amine derivative designated by a general formula [1] and a dibenzo-{[f,f']-4,4',7,7'-tetraphenyl}-diindeno-[1,2,3-cd:1', 2',3'-lm] perylene derivative designated by a general formula [2] mixed with each other. The doping amount of the perylene derivative is controlled by a vapor deposition rate, and is preferably between 1 and 10% with respect to the aromatic amine derivative for suppressing the concentration quenching of pigment itself. The luminescent layer 15 may be formed by stacking two layers each containing the above perylene derivative having different doping amounts.

The compound designated by the general formula [1] can be synthesized in accordance with a known process, for example, by reacting an anthracene derivative or an anthraquinone derivative with a substituted or non-substituted amine derivative in the presence of potassium carbonate, sodium carbonate, potassium hydroxide or sodium hydroxide in a solvent such as benzene, toluene and xylene. A catalyst employable therefor includes copper powder, cuprous chloride, tin, stannous chloride and pyridine.

The compound designated by the general formula [2] can be synthesized in accordance with a known process, for example, by reacting a benzo[k]fluoran derivative in the presence of aluminum chloride/sodium chloride, cobalt fluoride or thallium trifluoroacetate.

The use of the organic metal complex designated by the general formula [3] having a higher ionization potential in the electron transporting layer 16 increases the ionization potential of the electron transporting layer larger than that of the luminescent layer. As a result, the hole blocking ability of the electron transporting layer 16 is improved for preventing the leakage of the hole into the electron transporting layer, thereby further elevating the recombination yield between the hole and the electron in the luminescent layer.

The electron transporting material designated by the general formula [3] can also be synthesized in accordance with a known process, for example, by reacting a gallium compound with a compound having a part specified in a bracket of the general formula [3] and a ligand residue of "L". That is, alkyl gallium, gallium alkoxide, gallium halogenide, gallium nitride or gallium oxide is reacted with a compound having, as the ligands in the brackets of the general formula [3], two ligands of a quinoline residue such as 8-hydroxyquinoline and 2-methyl-8- hydroxyquinoline and one ligand (for the "L" ligand) of a halogen atom, substituted or non-substituted alkoxy group, aryloxy group or alkyl group in a solvent such as methanol, ethanol-benzene, toluene and tetrahydrofuran.

EXAMPLE 1

In an organic EL element of Example 1, an aromatic amine derivative designated by a compound [1] shown below was doped with dibenzotetraphenyl-peryfurantene designated by a compound [2] shown below in a vapor deposition rate of 2.5% to prepare a luminescent layer. An electron transporting layer was prepared by using a gallium metal complex designated by a compound [3] shown below. As a result, red light emission could be obtained having a current efficiency of 6 cd/A or more (up to 1,000 cd/m$^2$) and a maximum brightness of 38,000 cd/m$^2$ each of which was at the practical level. The chromaticity stability of the organic EL element was excellent, and the change of the color shade due to the applied voltage was small.

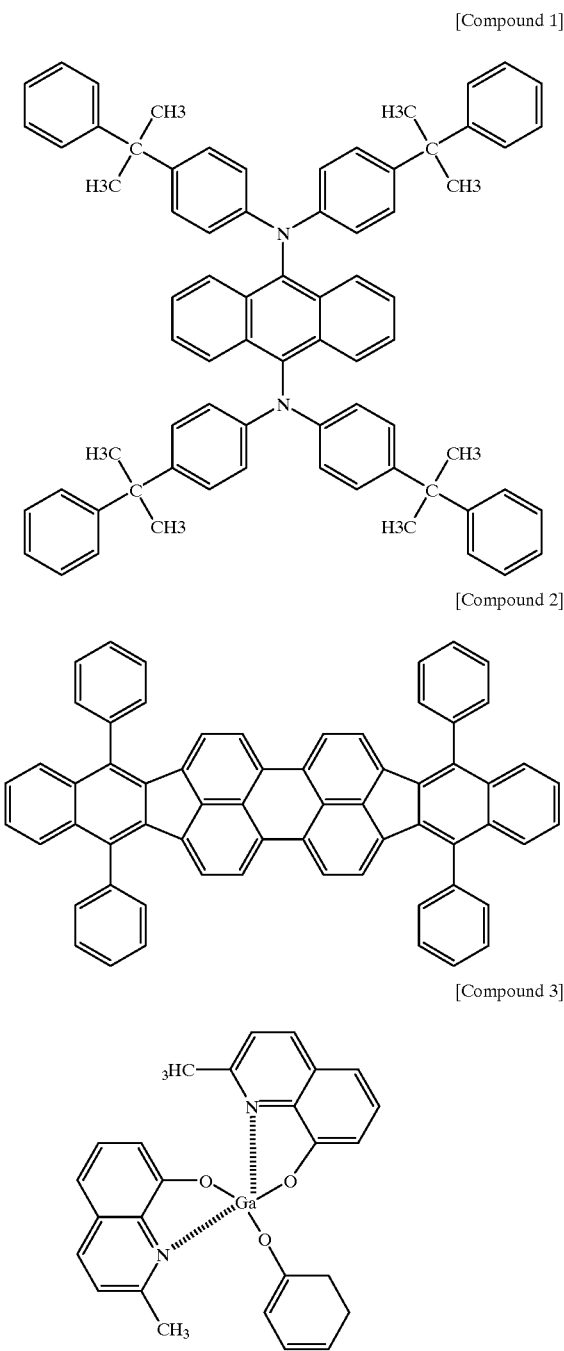

[Compound 1]

[Compound 2]

[Compound 3]

Figure 3:
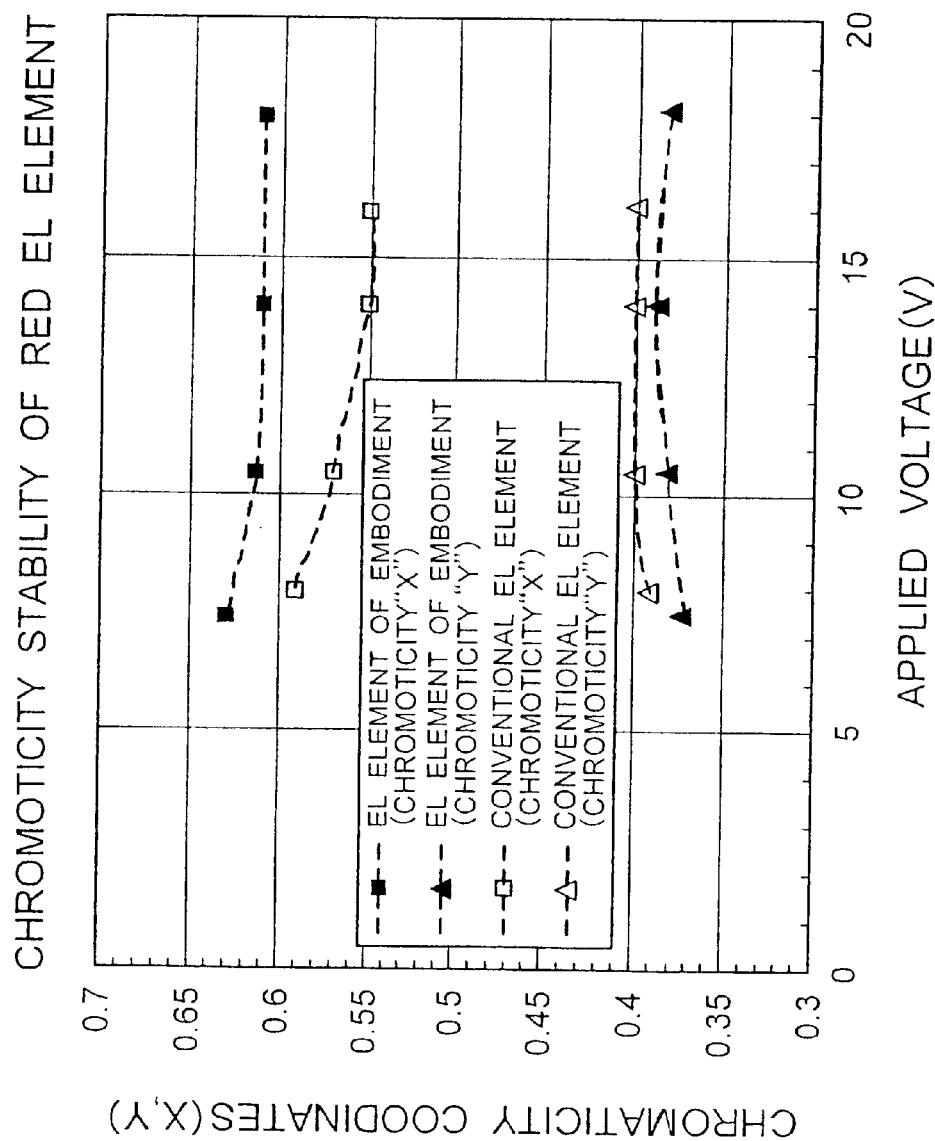
FIG. 3 is a graph showing a relation between color shade and applied voltages of the organic EL element of the Embodiment compared with the relation of the conventional EL element.

A graph of FIG. 3 shows the relations between the applied voltage (V, abscissa) and the coordinates of "X" and "Y" of the CIE chromaticity (ordinate) of the organic EL element of the Example 1 and of a conventional organic EL element. The conventional organic EL element includes a transparent anode 12, a hole injecting layer 13, a hole transporting layer 14, a luminescent layer 15, an electron transporting layer 16 and a cathode 17 sequentially stacked on a glass substrate 11. The luminescent layer 15 includes a conventional organic metal complex having a higher fluorescent quantum yield doped with a red light emitting material. The same or another organic metal complex having an electron transporting ability may be used in the electron transporting layer 16.

As shown therein, the change of the color shade in the chromaticity "X" was suppressed when the applied voltage was increased, compared with the conventional EL element.

Figure 4:
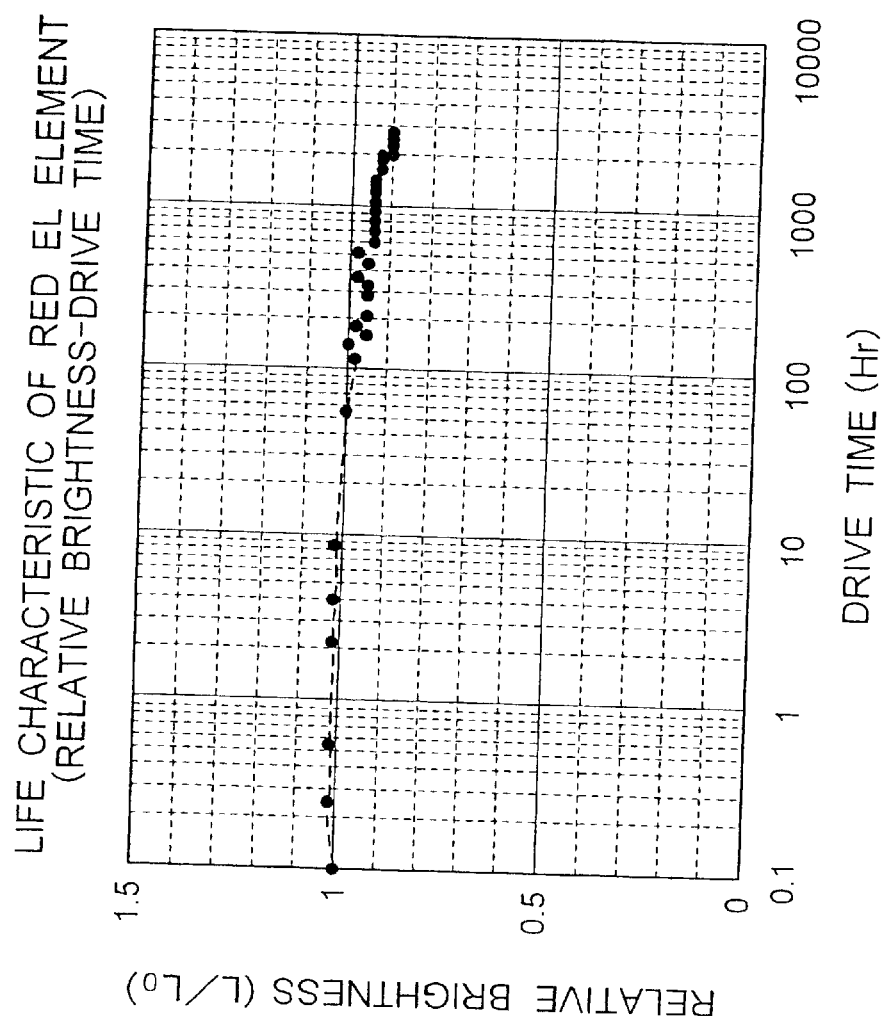
FIG. 4 is a graph showing a life characteristic of the organic EL element of the Embodiment.

As shown in a graph of FIG. 4 in which the abscissa indicates the driving time (Hr) and the ordinate indicates the relative brightness, the life characteristic of the organic EL element of the Example 1 at the constant current driving of 5 mA/cm$^2$ was improved. The organic EL element of the Example 1 maintained 90% or more of the initial brightness even after the lapse of 3,000 hours. Further, dark spots (non-emitting section) were seldom observed.

Comparative Example 1

Procedures similar to those used in Example 1 were conducted except that the aromatic amine derivative of the compound [1] was doped with a red light emitting material at 1% in weight to prepare a luminescent layer according to JP-A-10(1998)-72581. Similar results to those of Example 1 were obtained; that is, a maximum emitting efficiency of 41 m/W and a maximum brightness of 38,000 cd/m$^2$. However, the life time of the organic EL element of Comparative Example 1 was short. The stable emission at 3 mA/cm$^2$ continued for only about 1000 hours, and the practical use thereof seemed difficult.

Comparative Example 2

Procedures similar to the procedures used in Example 1 were conducted except that the compound [2] was used alone as luminescent layer (refer to JP-A-10(1998)-330295). Similar results to those of Example 1 were obtained, that is, red light emission having brightness of 1,250 cd/m$^2$ was obtained by applying a direct voltage of 15 V.

In addition, another luminescent layer was prepared by doping 4,4'-bis[N-phenyl-N-(1"-naphthyl)amino]biphenyl with the compound [2] at 5% in weight. In the organic EL element using the luminescent layer, red light emission having brightness of 2,650 cd/m$^2$ was obtained by applying a direct voltage of 15 V.

However, the brightness of these organic EL elements was much lower than that of Example 1, and the practical use thereof seemed difficult.

Comparative Example 3

Procedures similar to the procedures used in Example 1 were conducted except that the compound [4] was doped with the compound [2] at 8% in weight to prepare a luminescent layer (refer to JP-A-11(1999)-233261). Red light emission having brightness of about 52 cd/m$^2$ was obtained by applying a voltage of 9.7 V.

However, the brightness of the organic EL element after the stable and successive operation at the constant current for 2,700 hours was reduced as low as to 30 cd/m$^2$. The brightness of the organic EL element was much lower than that of Example 1 and the period of life was short. Accordingly, the practical use thereof seemed difficult.

Comparative Example 4

Procedures similar to the procedures used in Example 1 were conducted except that the gallium metal complex designated by the compound [3] was used as a luminescent layer (refer to JP-A-10(1998)-88121). Bluish green light emission having brightness of 15,000 cd/m² and a luminescent efficiency of 2.351 m/W was obtained by applying a direct voltage of 8 V.

The brightness and the luminescent efficiency were insufficient, and the brightness, the luminescent efficiency, the period of life and the chromaticity stability could be improved by using the metal complex of the general formula [3] as the electron transporting layer of the red EL element.

Comparative Example 5

Procedures similar to the procedures used in Example 1 were conducted except that a gallium metal complex [tris-(2-methyl-8-quinolinolate) gallium] and a perylene derivative were used as an electron injecting layer and a luminescent layer, respectively (refer to Japanese Patent No.2828821). Yellow light emission having brightness of 850 cd/m² was obtained by applying a direct voltage of 8 V. The period of life of light emission was 4 days. The brightness thereof was much lower than is that of Example 1, and the period of life was quite short.

EXAMPLE 2

Procedures similar to the procedures used in Example 1 were conducted except that the tris-(8-quinolinolate) aluminum designated by the general formula [4] was used as an electron transporting layer to fabricate an organic EL element. When a direct voltage was applied between a cathode and an anode of the EL element, red light emission could be obtained having a current efficiency of 6 cd/A or more (up to 1,000 cd/m²) and a maximum brightness of 38,000 cd/m².

EXAMPLE 3

Procedures similar to the procedures used in Example 1 were conducted except that the perylene derivative designated by the general formula [2b] was used to dope the aromatic amine derivative designated by the compound [1]. When a direct voltage was applied between a cathode and an anode of the EL element, red light emission could be obtained having a current efficiency of 5 cd/A or more (up to 1,000 cd/m²) and a maximum brightness of 33,000 cd/m².

[General Formula 2b]

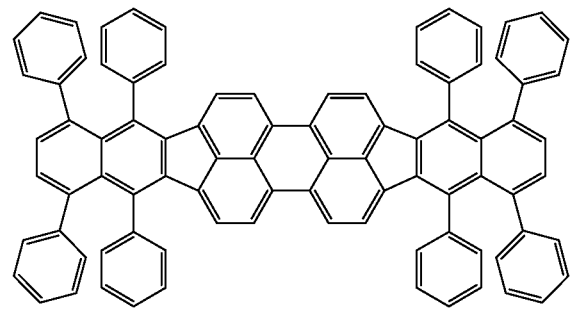

EXAMPLE 4

The aromatic amine derivative designated by the compound [1] was doped with the compound [2b] at a vapor deposition rate of 2.5% to fabricate the luminescent layer of the organic EL device of the present Example. The gallium metal complex [3a] was used to prepare the electron transporting layer. When a direct voltage was applied between a cathode and an anode of the EL element, red light emission could be obtained having a current efficiency of 6.8 cd/A or more (up to 1,000 cd/m²) and a maximum brightness of 45,000 cd/m².

EXAMPLE 5

The organic EL device was fabricated in accordance with the procedures of Example 4 except that the gallium metal complexes [3a] and [3b] were used to prepare the electron transporting layer. The ratio between the gallium metal complexes [3a] and [3b] was 9:1 in weight. When a direct voltage was applied between a cathode and an anode of the EL element, red light emission could be obtained having a current efficiency of 6.6 cd/A or more (up to 1,000 cd/m²) and a maximum brightness of 43,000 cd/m².

[General Formula 3a]

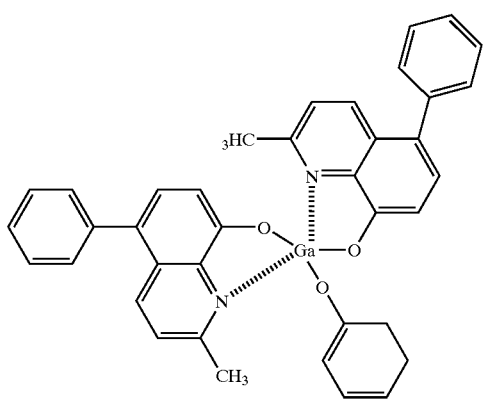

-continued

[General Formula 3b]

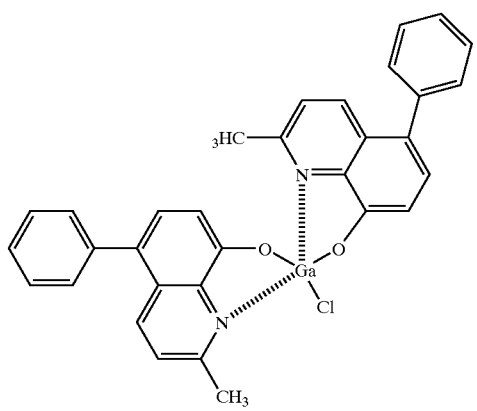

EXAMPLE 6

The organic EL device was fabricated in accordance with the procedures of Example 4 except that the gallium metal complex [3] was used to prepare the electron transporting layer. When a direct voltage was applied between a cathode and an anode of the EL element, red light emission could be obtained having a current efficiency of 6 cd/A or more (up to 1,000 cd/m$^2$) and a maximum brightness of 38,000 cd/m$^2$.

EXAMPLE 7

The aromatic amine derivative designated by the compound [1] was doped with a compound of general formula [2a] at a vapor deposition rate of 2.5% to fabricate the luminescent layer of the organic EL device of the present Example. The gallium metal complex [3a] was used to prepare the electron transporting layer. When a direct voltage was applied between a cathode and an anode of the EL element, red light emission could be obtained having a current efficiency of 6.5 cd/A or more (up to 1,000 cd/m$^2$) and a maximum brightness of 42,000 cd/m$^2$.

[General Formula 2a]

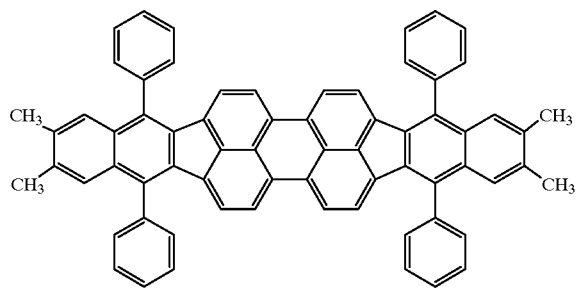

EXAMPLE 8

The organic EL device was fabricated in accordance with the procedures of Example 7 except that the gallium metal complexes [3a] and [3b] were used to prepare the electron transporting layer. The ratio between the gallium metal complexes [3a] and [3b] was 9:1 in weight. When a direct voltage was applied between a cathode and an anode of the EL element, red light emission could be obtained having a current efficiency of 6.4 cd/A or more (up to 1,000 cd/m$^2$) and a maximum brightness of 41,000 cd/m$^2$.

EXAMPLE 9

The organic EL device was fabricated in accordance with the procedures of Example 7 except that the gallium metal complex [3] was used to prepare the electron transporting layer. When a direct voltage was applied between a cathode and an anode of the EL element, red light emission could be obtained having a current efficiency of 5.8 cd/A or more (up to 1,000 cd/m$^2$) and a maximum brightness of 37,000 cd/m$^2$.

The characteristics of the organic EL devices of Examples 1 and 4 to 9 are shown in Table 1.

TABLE 1

|  | Life Time at Room Temp. (hr)* | Efficiency at 100 cd/m$^2$ (cd/A) | Maximum Brightness (cd/m$^2$) | Life Time at 85° C. (hr)* | Chromaticity @ 1000 cd/m$^2$ |
| --- | --- | --- | --- | --- | --- |
| Example 1 | 10000 | 6 | 38000 | 500 | (0.62, 0.38) |
| Example 4 | 15000 | 6.8 | 45000 | 1900 | (0.63, 0.36) |
| Example 5 | 16000 | 6.6 | 43000 | ≧2000 | (0.63, 0.37) |
| Example 6 | 10000 | 6 | 38000 | 700 | (0.63, 0.37) |
| Example 7 | ≧12000 | 6.5 | 42000 | 1600 | (0.62, 0.37) |
| Example 8 | ≧12000 | 6.4 | 41000 | ≧2000 | (0.62, 0.37) |
| Example 9 | 10000 | 5.8 | 37000 | 600 | (0.62, 0.38) |

*Initial: 200 cd/m$^2$

EXAMPLE 10

The aromatic amine derivative designated by the compound [1] was doped with dibenzotetraphenyl-perifurantene of the compound [2] at a vapor deposition rate of 2.5% to fabricate the luminescent layer. The gallium metal complex [3a] was used to prepare the electron transporting layer in the present Example.

Figure 5A:
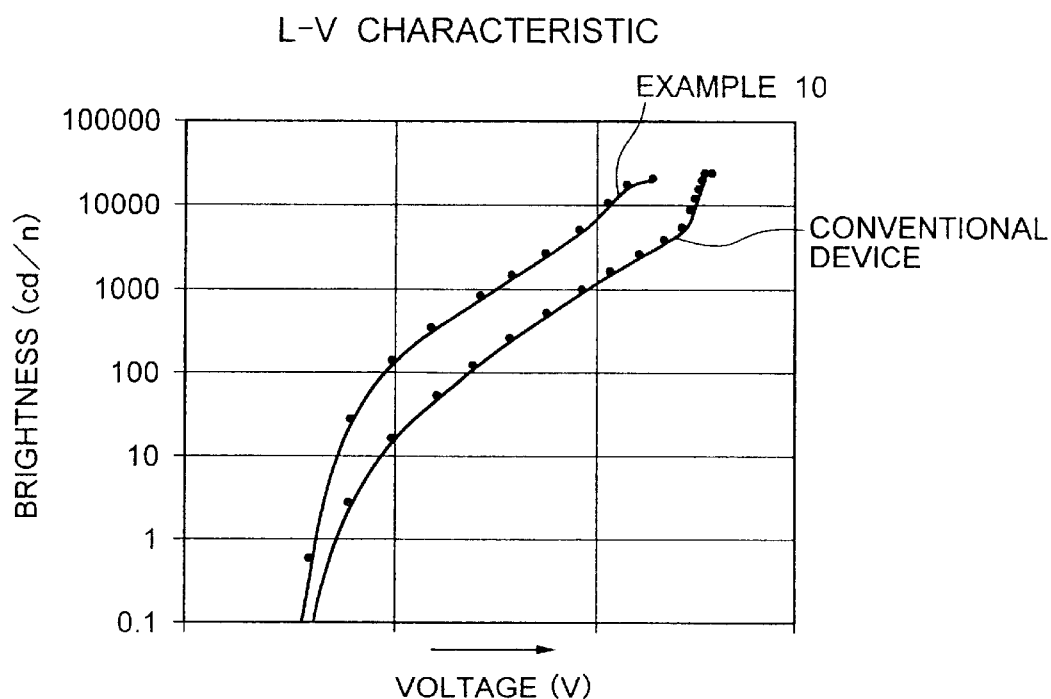
FIGS. 5A and 5B are graphs showing an L-V characteristic and a J-V characteristic, respectively, of the device of Example 10 compared with a conventional device.
Figure 5B:
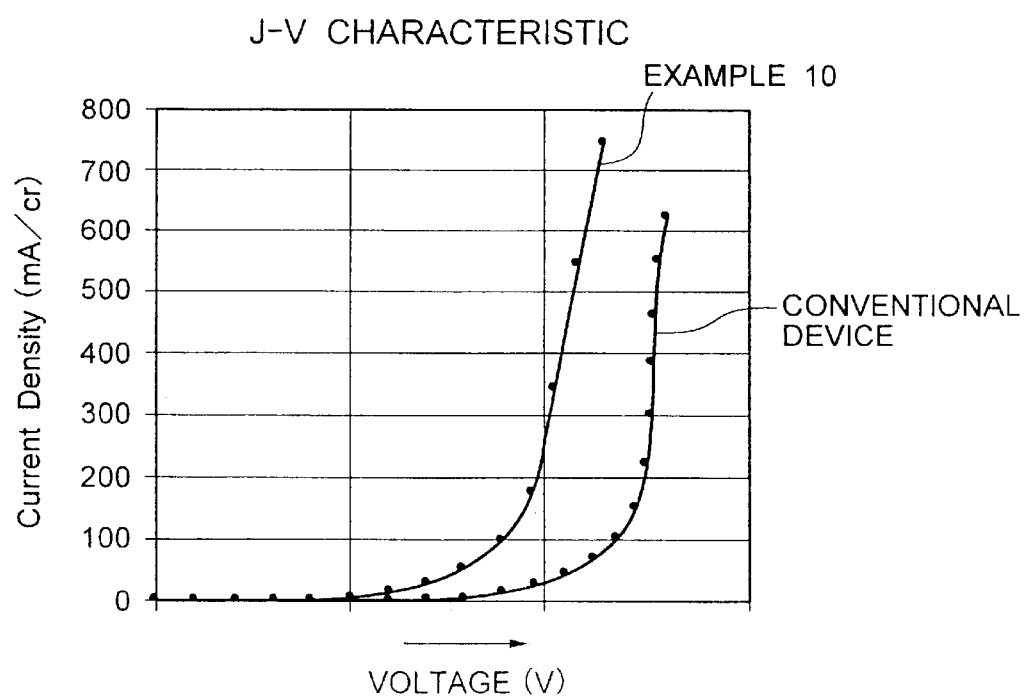

The L-V characteristic and the J-V characteristic of the device of Example 10 compared with a conventional device were shown in FIGS. 5A and 5B, respectively. The conventional device included the luminescent layer having tris-(8-quinolinolate) aluminum designated by the compound [4] doped with the red dopant (DCM) designated by the compound [5], and the electron transporting layer having tris-(8-quinolinolate) aluminum designated by the compound [4]. As apparently shown in the graphs of FIGS. 5A and 5B, the device of Example 10 could be operated at the lower voltage than the conventional red device.

[Compound 5]

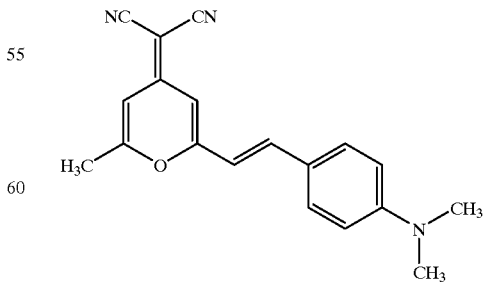

Since the above embodiments are described only for examples, the present invention is not limited to the above embodiments and various modifications or alternations can be easily made therefrom by those skilled in the art without departing from the scope of the present invention.

What is claimed is:

1. An organic EL element comprising an anode and a cathode opposing to each other, and at least one luminescent layer, sandwiched therebetween, including an aromatic amine derivative designated by a general formula [1] (wherein each of R1 to R28 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, each of Y1 to Y4 is independently selected from the group consisting of O, S, $SO_2$, C=O, $CH_2O$, $CH_2OCH_2$ and a substituted or non-substituted alkylene group, and two of R1 to R4 and/or two of R5 to R8 may be bonded to form a substituted or non-substituted five-membered or six-membered ring) and a dibenzo-{[f,f']-4,4', 7,7'-tetraphenyl}-diindeno[1,2,3-cd:1',2',3'-lm] perylene derivative designated by a general formula [2] (wherein each of X1 to X20 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, and two of X1 to X20 may be bonded to form a substituted or non-substituted five-membered or six-membered ring):

[General Formula 1]

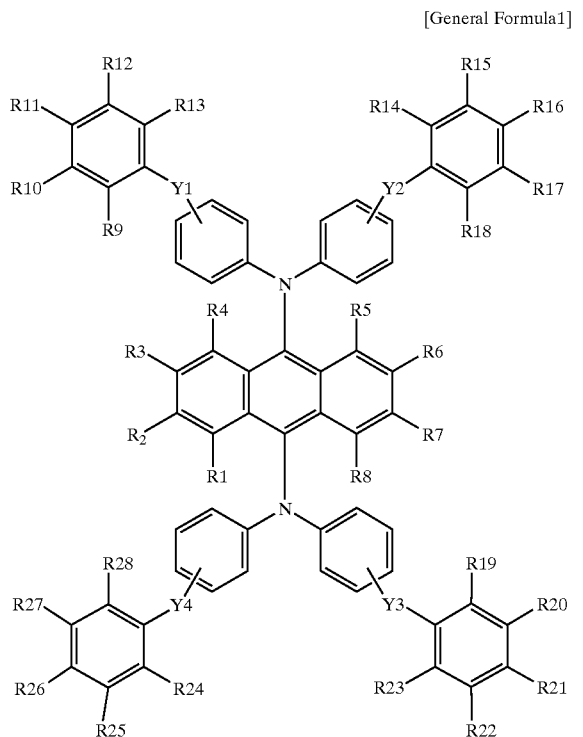

[General Formula 2]

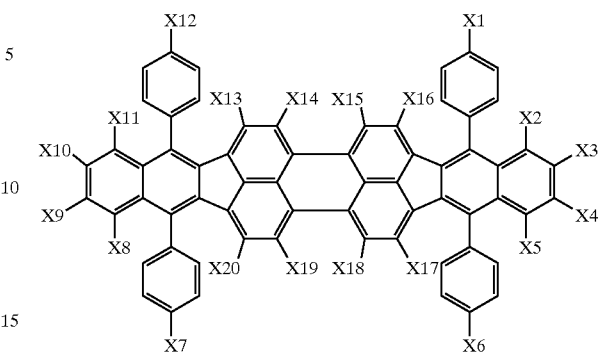

said organic EL element further comprising an electron injection layer or an electron transporting layer including an organic metal complex designated by a general formula [3] (wherein M designates a metal atom, each of R1 to R 6 is independently selected from the group consisting of a hydrogen atom, a halogen atom, a substituted or non-substituted alkyl group, a substituted or non-substituted alkoxy group, a substituted or non-substituted aryl group, a substituted or non-substituted aryloxy group, a substituted or non-substituted cycloalkyl group and a cyano group, L designates a ligand having a halogen atom, a substituted or non-substituted alkoxy group, a substituted or non-substituted aryloxy group, a substituted or non-substituted alkyl group or a substituted or non-substituted cycloalkyl group):

[General Formula 3]

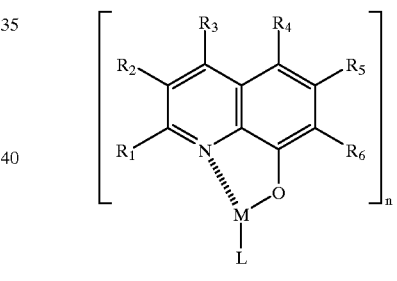

wherein the R4 of the organic metal complex of the general formula [3] is the aryl group, and n is 1 or 2.

2. An organic EL element as defined in claim 1, wherein said luminescent layer includes an aromatic amine derivative designated by a general formula [4] (wherein each of R1 to R28 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, each of Y1 to Y4 is independently selected from the group consisting of O, S, $SO_2$, C=O, $CH_2O$, $CH_2OCH_2$ and a substituted or non-substituted alkylene group, and two of R1 to R4 and/or two of R5 to R8 may be bonded to form a substituted or non-substituted five-membered or six-membered ring) and a dibenzo-{[f,f']-4,4',7,7'-tetraphenyl}-diindeno[1,2,3-cd:1', 2',3'-lm] perylene derivative designated by a general formula [2] (wherein each of X1 to X20 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, and two of X1 to X20 may be bonded to form a substituted or non-substituted five-membered or six-membered ring):

[General Formula 4]

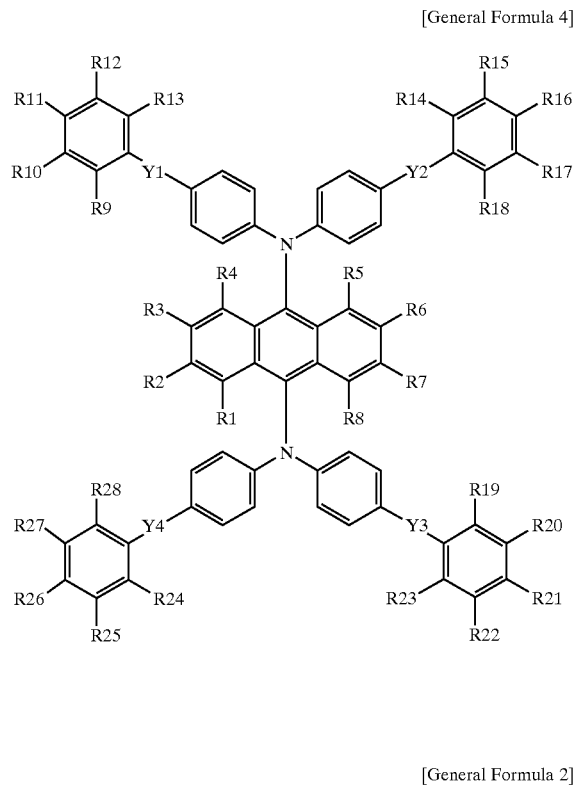

[General Formula 2]

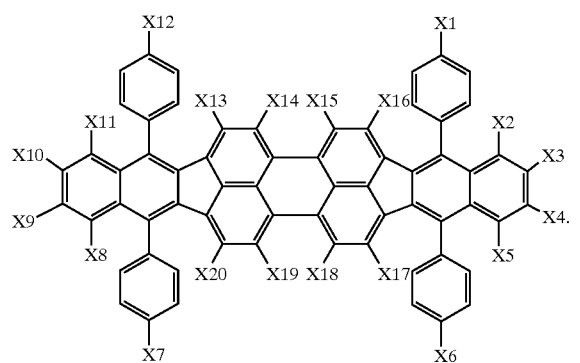

3. An organic EL element as defined in claim 1, wherein said luminescent layer includes an aromatic amine derivative designated by a general formula [5] (wherein each of R1 to R28 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, each of X1 to X8 is independently selected from the group consisting of a substituted or non-substituted alkyl group having a carbon number of 1 to 20 and a substituted or non-substituted aryl group having a carbon number of 6 to 16, and two of R1 to R4 and/or two of R5 to R8 may be bonded to form a substituted or non-substituted five-membered or six-membered ring) and a dibenzo{[f,f'-4,4',7,7'-tetraphenyl]-diindeno[1,2,3-cd:1',2',3'-lm] perylene derivative designated by a general formula [2] (wherein each of X1 to X20 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, and two of X1 to X20 may be bonded to form a substituted or non-substituted five-membered or six-membered ring):

[General Formula 5]

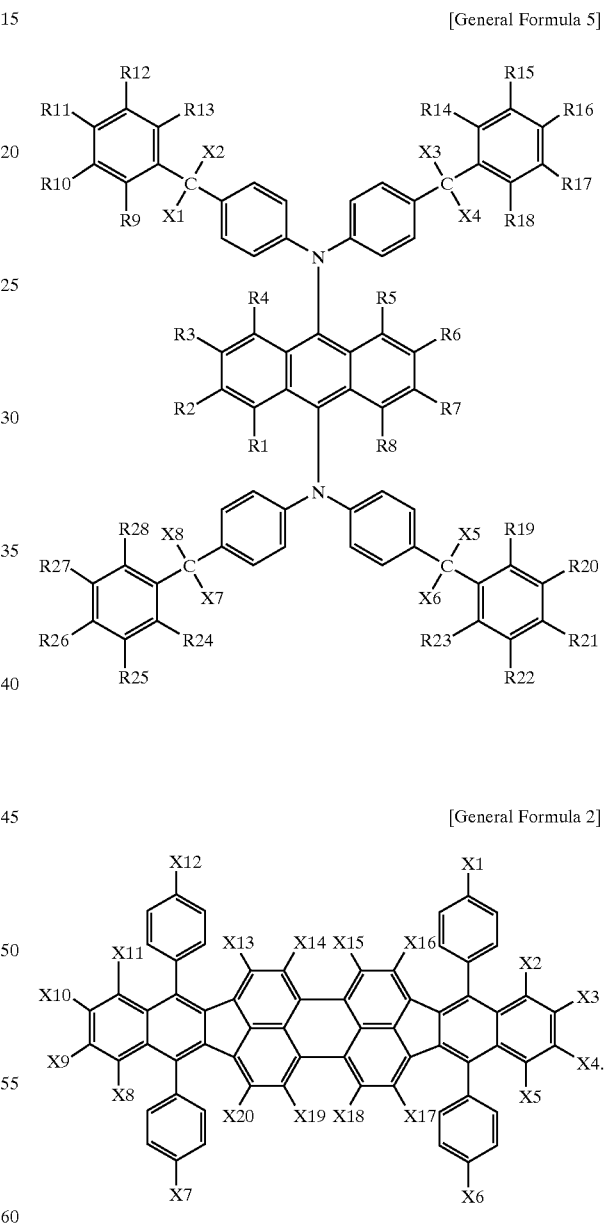

4. The organic EL element as defined in claim 1, wherein the dibenzo-{[f,f']-4,4',7,7'-tetraphenyl}-diindeno[1,2,3-cd:1',2',3'-lm] perylene derivative designated by the general formula [2] is a compound designated by a general formula [2a]:

[General Formula 2a]

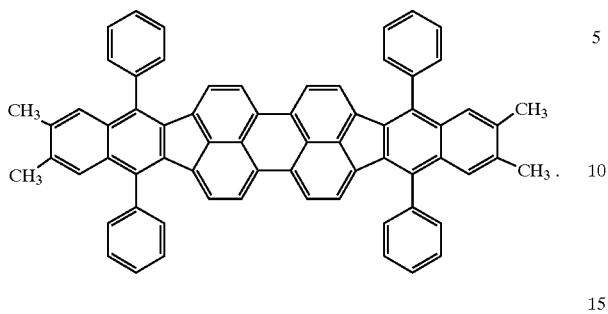

5. The organic EL element as defined in claim 1, wherein the dibenzo-{[f,f']-4,4',7,7'-tetraphenyl}-diindeno[1,2,3-cd:1',2',3'-lm] perylene derivative designated by the general formula [2] is a compound designated by a general formula [2b]:

[General Formula 2b]

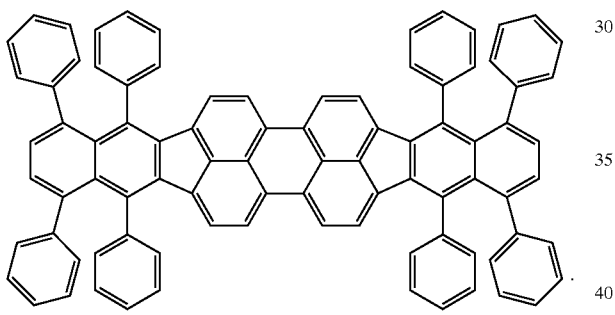

6. The organic EL element as defined in claim 1, wherein the aromatic amine derivative designated by the general formula [1] is used as a host doped with the perylene derivative designated by the general formula [2] at a doping ratio between 1 and 10%.

7. The organic EL element as defined in claim 2, wherein the aromatic amine derivative designated by the general formula [4] is used as a host doped with the perylene derivative designated by the general formula [2] at a doping ratio between 1 and 10%.

8. The organic EL element as defined in claim 3, wherein the aromatic amine derivative designated by the general formula [5] is used as a host doped with the perylene derivative designated by the general formula [2] at a doping ratio between 1 and 10%.

9. The organic EL element as defined in claim 1, wherein the organic metal complex of the general formula [3] is a compound designated by a general formula [3a]:

[General Formula 3a]

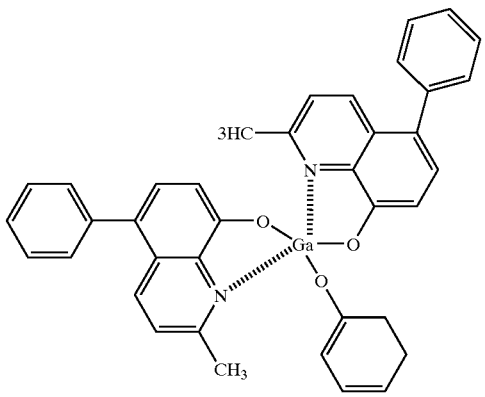

10. The organic EL element as defined in claim 1, wherein the organic metal complex of the general formula [3] is a compound designated by a general formula [3b]:

[General Formula 3b]

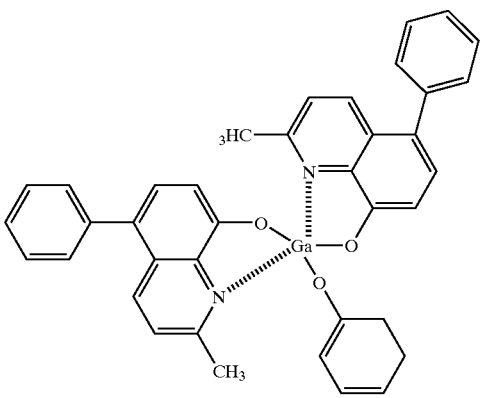

11. The organic EL element as defined in claim 1, wherein the electron injection layer or the electron transporting layer includes a plurality of the organic metal complexes designated by the general formula [3].

12. The organic EL element as defined in claim 1, wherein the electron injection layer or the electron transporting layer includes the compounds designated by the general formulae [3a] and [3b],

[General Formula 3a]

[General Formula 3b]

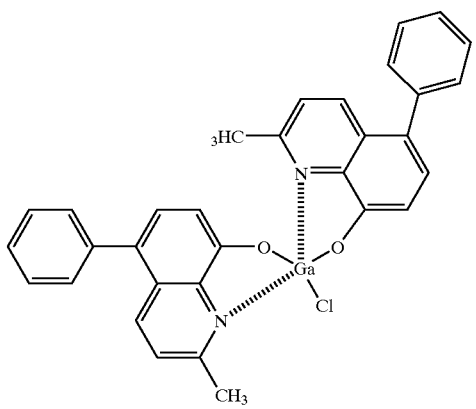

13. The organic EL element as defined in claim 1, wherein the electron injection layer or the electron transporting layer includes a luminescent organic aluminum complex designated by (Q)3-Al (wherein "Q" is a substituted or non-substituted 8-quinolinolate ligand).

14. An organic EL display comprising the organic EL element as defined in claim 1.

15. An organic EL display element as defined in claim 1, wherein M designated by the general formula [3] is Ga.

16. An organic EL element comprising an anode and a cathode opposing to each other, and at least one luminescent layer, sandwiched therebetween, including an aromatic amine derivative designated by a general formula [1] (wherein each of R1 to R28 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, each of Y1 to Y4 is independently selected from the group consisting of O, S, $SO_2$, C=O, $CH_2O$, $CH_2OCH_2$ and a substituted or non-substituted alkylene group, and two of R1 to R4 and/or two of R5 to R8 may be bonded to form a substituted or non-substituted five-membered or six-membered ring) and a dibenzo-{[f,f']-4,4', 7,7'-tetraphenyl}-diindeno[1,2,3-cd:1',2',3'-lm] perylene derivative designated by a general formula [2] (wherein each of X1 to X20 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, and two of X1 to X20 may be bonded to form a substituted or non-substituted five-membered or six-membered ring):

[General Formula 1]

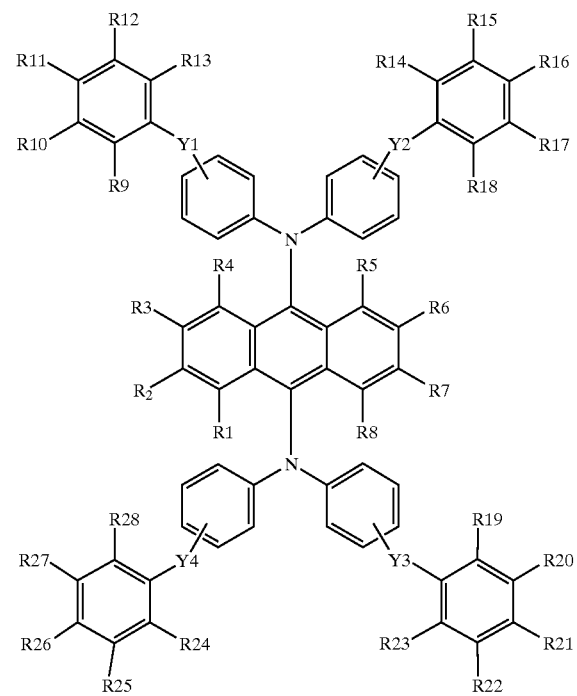

[General Formula 2]

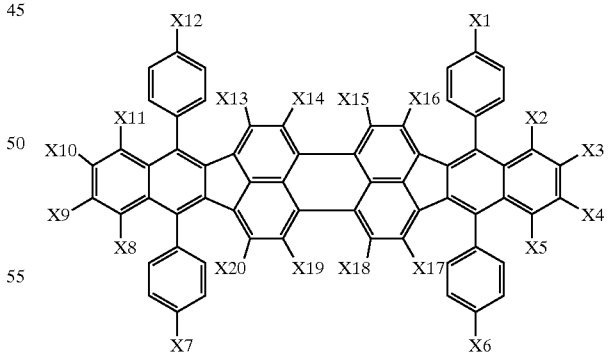

said organic EL element further comprising an electron injection layer or an electron transporting layer including an organic metal complex designated by a general formula [3] (wherein M designates a metal atom, each of R1 to R6 is independently selected from the group consisting of a hydrogen atom, a halogen atom, a substituted or non-substituted alkyl group, a substituted or non-substituted alkoxy group, a substituted or non-substituted aryl group, a substituted or non-substituted aryloxy group, a substituted or non-substituted cycloalkyl group and a cyano group, L designates a ligand having a halogen atom, a substituted or non-substituted alkoxy group, a substituted or non-substituted aryloxy group, a substituted or non-substituted alkyl group or a substituted or non-substituted cycloalkyl group):

[General Formula 3]

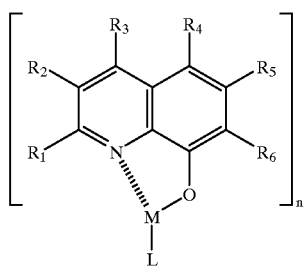

wherein the electron injection layer or the electron transporting layer includes a plurality of the organic metal complexes designated by the general formula [3], and n is 1 or 2.

17. An organic EL element as defined in claim 16, wherein said luminescent layer includes an aromatic amine derivative designated by a general formula [4] (wherein each of R1 to R 28 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, each of Y1 to Y4 is independently selected from the group consisting of O, S, $SO_2$, C=O, $CH_2O$, $CH_2OCH_2$ and a substituted or non-substituted alkylene group, and two of R1 to R4 and/or two of R5 to R8 may be bonded to form a substituted or non-substituted five-membered or six-membered ring) and a dibenzo-{[f,f']-4,4',7,7'-tetraphenyl}-diindeno[1,2,3-cd:1', 2', 3'-lm] perylene derivative designated by a general formula [2] (wherein each of X1 to X20 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, and two of X1 to X20 may be bonded to form a substituted or non-substituted five-membered or six-membered ring):

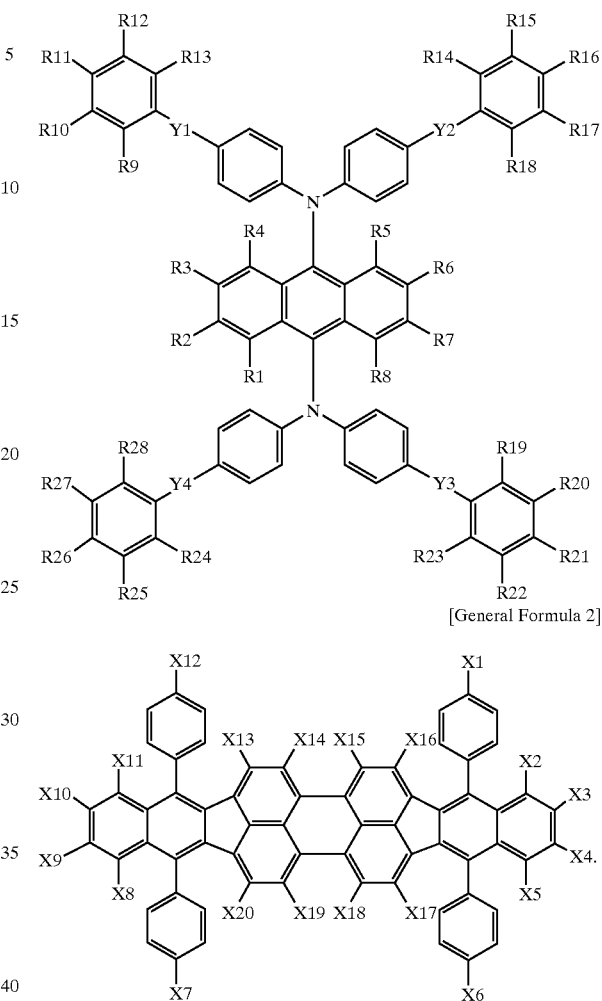

[General Formula 4]

[General Formula 2]

18. An organic EL element as defined in claim 16, wherein said luminescent layer includes an aromatic amine derivative designated by a general formula [5] (wherein each of R1 to R 28 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, each of X1 to X8 is independently selected from the group consisting of a substituted or non-substituted alkyl group having a carbon number of 1 to 20 and a substituted or non-substituted aryl group having a carbon number of 6 to 16, and two of R1 to R4 and/or two of R5 to R8 may be bonded to form a substituted or non-substituted five-membered or six-membered ring) and a dibenzo{[f,f'-4,4',7,7'-tetraphenyl]-diindeno[1,2,3-cd:1',2',3'-lm] perylene derivative designated by a general formula [2] (wherein each of X1 to X20 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, and two of X1 to X20 may be bonded to form a substituted or non-substituted five-membered or six-membered ring):

[General Formula 5]

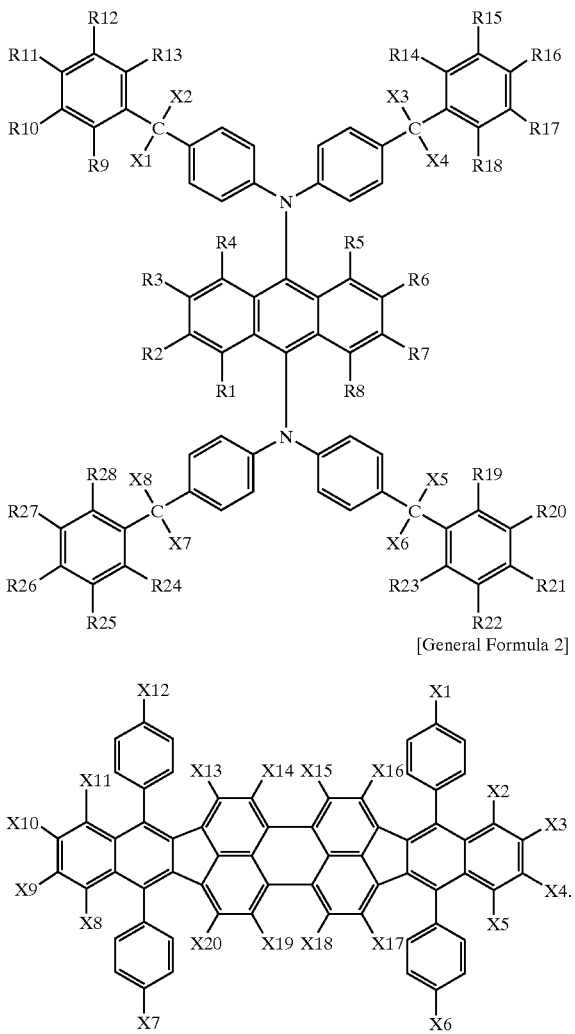

[General Formula 2]

19. The organic EL element as defined in claim 16, wherein the dibenzo-{[f,f']-4,4',7,7'-tetraphenyl}-diindeno [1,2,3-cd:1',2',3'-lm] perylene derivative designated by the general formula [2] is a compound designated by a general formula [2a]:

[General Formula 2a]

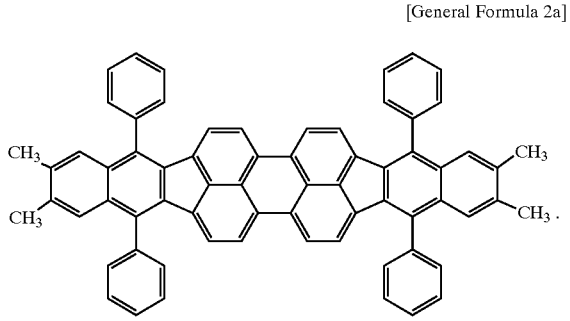

20. The organic EL element as defined in claim 16, wherein the dibenzo-{[f,f']-4,4',7,7'-tetraphenyl}-diindeno [1,2,3-cd:1',2',3'-lm] perylene derivative designated by the general formula [2] is a compound designated by a general formula [2b]:

[General Formula 2b]

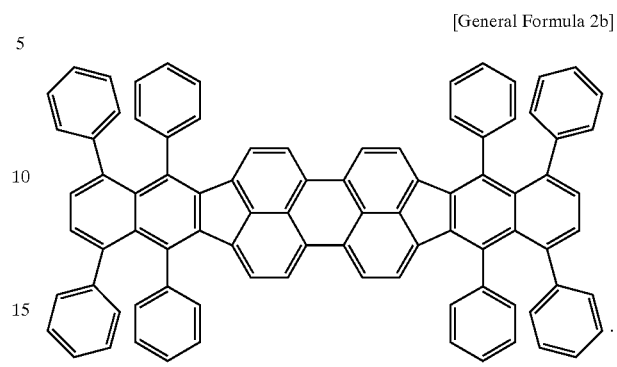

21. The organic EL element as defined in claim 16, wherein the aromatic amine derivative designated by the general formula [1] is used as a host doped with the perylene derivative designated by the general formula [2] at a doping ratio between 1 and 10%.

22. The organic EL element as defined in claim 17, wherein the aromatic amine derivative designated by the general formula [4] is used as a host doped with the perylene derivative designated by the general formula [2] at a doping ratio between 1 and 10%.

23. The organic EL element as defined in claim 18, wherein the aromatic amine derivative designated by the general formula [5] is used as a host doped with the perylene derivative designated by the general formula [2] at a doping ratio between 1 and 10%.

24. The organic EL element as defined in claim 16, wherein the electron injection layer or the electron transporting layer includes a luminescent organic aluminum complex designated by (Q)3-Al (wherein "Q" is a substituted or non-substituted 8-quinolinolate ligand).

25. An organic EL display comprising the organic EL element as defined in claim 16.

26. An organic EL display element as defined in claim 16, wherein M designated by the general formula [3] is Ga.

27. An organic EL element comprising an anode and a cathode opposing to each other, and at least a luminescent layer, positioned therebetween, including an aromatic amine derivative designated by a general formula [6] (wherein each of R1 to R 28 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, and two of R1 to R4 and/or two of R5 to R8 may be bonded to form a substituted or non-substituted five membered or six-membered ring) and a dibenzo{[f,f']-4,4',7,7'-tetraphenyl}-diindeno[1,2,3-cd:1', 2',3'-lm] perylene derivative designated by a general formula [2] (wherein each of X1 to X20 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, and two of X1 to X20 may be bonded to form a substituted or non-substituted five-membered or six-membered ring):

[General Formula 6]

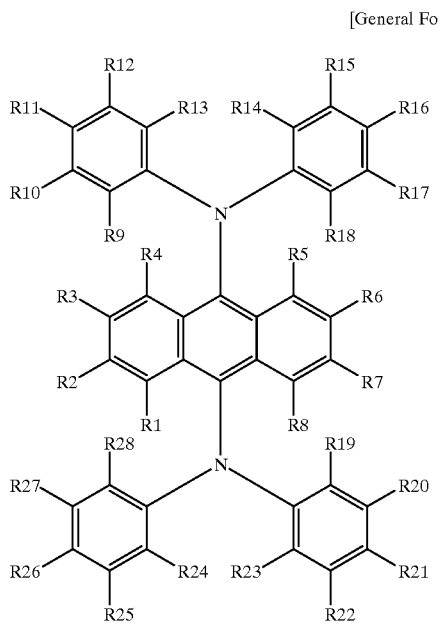

[General Formula 2]

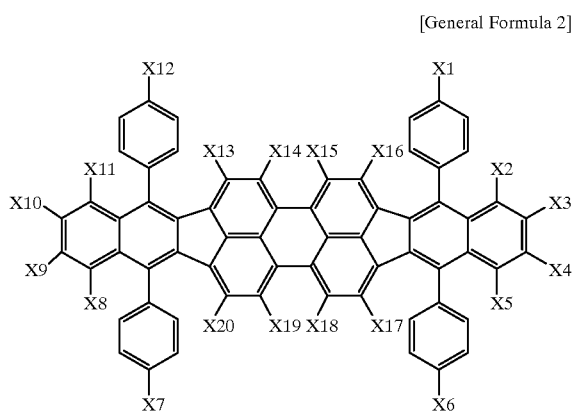

said organic EL element further comprising an electron injection layer or an electron transporting layer including an organic metal complex designated by a general formula [3] (wherein M designates a metal atom, each of R1 to R6 is independently selected from the group consisting of a hydrogen atom, a halogen atom, a substituted or non-substituted alkyl group, a substituted or non-substituted alkoxy group, a substituted or non-substituted aryl group, a substituted or non-substituted aryloxy group, a substituted or non-substituted cycloalkyl group and a cyano group, L designates a ligand having a halogen atom, a substituted or non-substituted alkoxy group, a substituted or non-substituted aryloxy group, a substituted or non-substituted alkyl group or a substituted or non-substituted cycloalkyl group):

[General Formula 3]

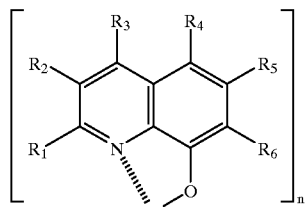

wherein the R4 of the organic metal complex of the general formula [3] is the aryl group, and n is 1 or 2.

28. The organic EL element as defined in claim 27, wherein the aromatic amine derivative designated by the general formula [6] is used as a host doped with the perylene derivative designated by the general formula [2] at a doping ratio between 1 and 10%.

29. An organic EL element comprising an anode and a cathode opposing to each other, and at least a luminescent layer, positioned therebetween, including an aromatic amine derivative designated by a general formula [6] (wherein each of R1 to R 28 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, and two of R1 to R4 and/or two of R5 to R8 may be bonded to form a substituted or non-substituted five membered or six-membered ring) and a dibenzo{[f,f']-4,4',7,7'-tetraphenyl}-diindeno[1,2,3-cd:1',2',3'-lm] perylene derivative designated by a general formula [2] (wherein each of X1 to X20 is independently selected from the group consisting of a hydrogen atom, a halogen atom, a substituted or non-substituted alkyl group, a substituted or non-substituted alkoxy group, a substituted or non-substituted aryl group and a substituted or non-substituted amino group, and two of X1 to X20 may be bonded to form a substituted or non-substituted five-membered or six-membered ring):

[General Formula 6]

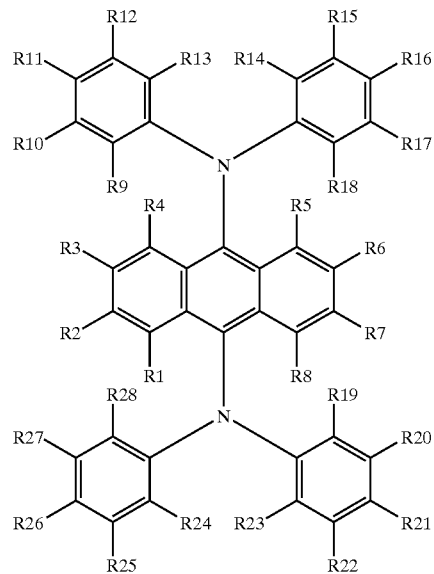

[General Formula 2]

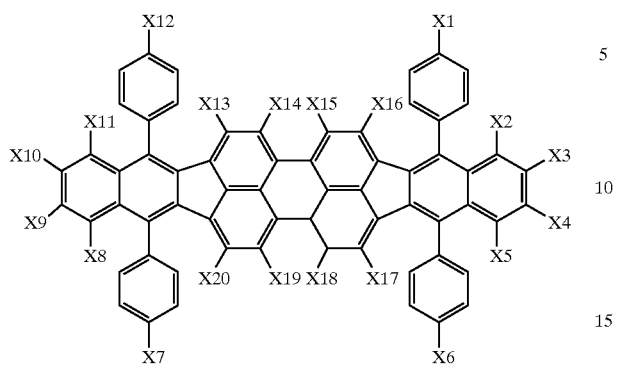

said organic EL element further comprising an electron injection layer or an electron transporting layer including an organic metal complex designated by a general formula [3] (wherein M designates a metal atom, each of R1 to R 6 is independently selected from the group consisting of a hydrogen atom, a halogen atom, a substituted or non-substituted alkyl group, a substituted or non-substituted alkoxy group, a substituted or non-substituted aryl group, a substituted or non-substituted aryloxy group, a substituted or non-substituted cycloalkyl group and a cyano group, L designates a ligand having a halogen atom, a substituted or non-substituted alkoxy group, a substituted or non-substituted aryloxy group, a substituted or non-substituted alkyl group or a substituted or non-substituted cycloalkyl group):

[General Formula 3]

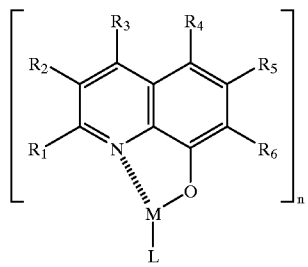

wherein the electron injection layer or the electron transporting layer includes a plurality of the organic metal complexes designated by the general formula [3], and n is 1 or 2.

30. The organic EL element as defined in claim 29, wherein the aromatic amine derivative designated by the general formula [6] is used as a host doped with the perylene derivative designated by the general formula [2] at a doping ratio between 1 and 10%.

* * * * *